(12) United States Patent
Zhang et al.

(10) Patent No.: US 11,502,703 B2
(45) Date of Patent: Nov. 15, 2022

(54) DESCRAMBLER FOR MEMORY SYSTEMS AND METHOD THEREOF

(71) Applicant: SK hynix Inc., Gyeonggi-do (KR)

(72) Inventors: Fan Zhang, Fremont, CA (US); Aman Bhatia, Los Gatos, CA (US); Xuanxuan Lu, San Jose, CA (US); Haobo Wang, San Jose, CA (US); Meysam Asadi, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 17 days.

(21) Appl. No.: 16/879,492

(22) Filed: May 20, 2020

(65) Prior Publication Data

US 2021/0367616 A1 Nov. 25, 2021

(51) Int. Cl.
*H03M 13/11* (2006.01)
*H03M 13/15* (2006.01)
*G06F 11/10* (2006.01)

(52) U.S. Cl.
CPC ..... *H03M 13/1102* (2013.01); *G06F 11/1012* (2013.01); *H03M 13/116* (2013.01); *H03M 13/1177* (2013.01); *H03M 13/1575* (2013.01); *G06F 2212/1036* (2013.01); *G06F 2212/7211* (2013.01)

(58) Field of Classification Search
CPC ..... G06F 2212/1036; G06F 2212/7211; G06F 11/10; G11C 7/1012; H03M 13/1177; H03M 13/116; H03M 13/1575; H03M 13/1102; H03M 13/1515; H03M 13/152; H03M 13/23; H03M 13/251; H03M 13/256; H03M 13/2957
See application file for complete search history.

(56) References Cited

U.S. PATENT DOCUMENTS

| | | | |
|---|---|---|---|
| 7,039,854 B1 * | 5/2006 | Ireland | H03M 13/1575 708/492 |
| 8,099,653 B2 | 1/2012 | Kanda et al. | |
| 8,102,996 B2 | 1/2012 | Takeuchi | |
| 8,261,159 B1 * | 9/2012 | Sommer | G06F 11/1048 714/768 |
| 8,745,468 B1 * | 6/2014 | Zhang | H03M 13/658 714/774 |
| 9,612,958 B1 * | 4/2017 | Asnaashari | G11C 13/0069 |
| 10,496,288 B1 * | 12/2019 | Morley | G06F 3/0647 |
| 2013/0212315 A1 * | 8/2013 | Steiner | G06F 12/0246 711/103 |
| 2014/0310534 A1 * | 10/2014 | Gurgi | G06F 12/1408 713/193 |
| 2015/0085573 A1 * | 3/2015 | Sharon | G11C 16/26 365/185.03 |

(Continued)

*Primary Examiner* — Steve N Nguyen
(74) *Attorney, Agent, or Firm* — IP & T Group LLP

(57) ABSTRACT

A descrambler receives data from a memory device. The descrambler calculates a sub-syndrome weight for multiple bits in each of the plurality of descrambled sequences using a set parity check matrix to generate multiple sub-syndrome weights, one for each of the plurality of descrambled sequences. The descrambler selects a sub-syndrome weight among the multiple sub-syndrome weights. The descrambler determines, as a correct scrambler sequence for descrambling the data, a scrambler sequence corresponding to the selected sub-syndrome weight, among the plurality of scrambler sequences.

12 Claims, 12 Drawing Sheets

(56) References Cited

U.S. PATENT DOCUMENTS

2015/0378890 A1* 12/2015 Lien .................. G11C 8/06
  711/159
2019/0393901 A1* 12/2019 Fainzilber ......... H04L 25/03866

* cited by examiner

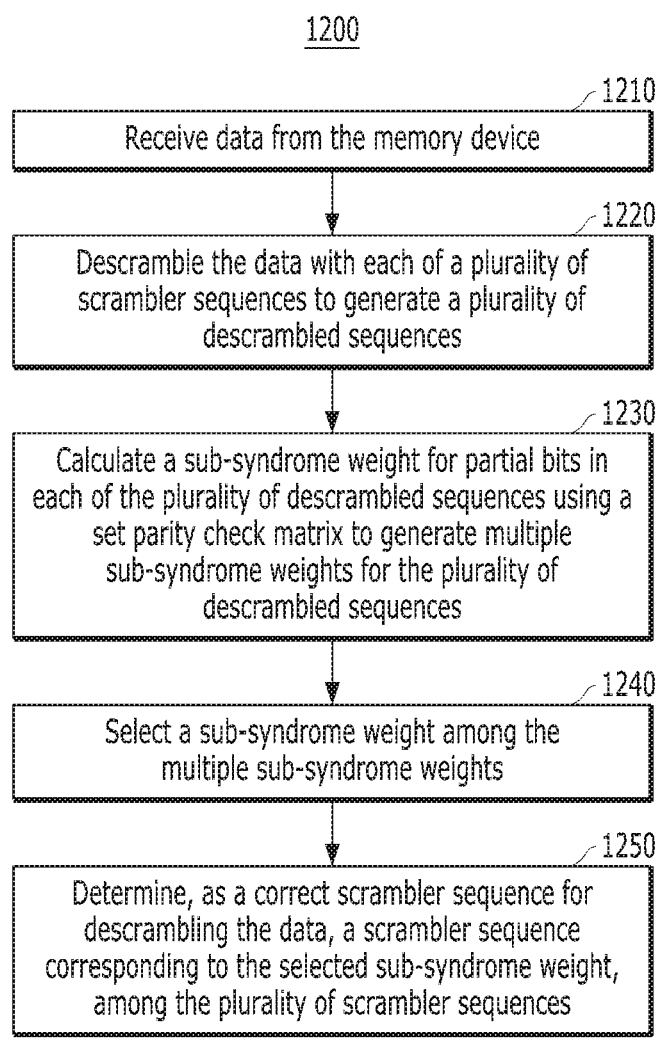

DESCRAMBLER FOR MEMORY SYSTEMS AND METHOD THEREOF

BACKGROUND

1. Field

Embodiments of the present disclosure relate to a descrambler for memory systems.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems such as NAND flash based memory systems may include a scrambler for scrambling data, which is to be written to the memory devices, and a descrambler for descrambling data, which is read from the memory device.

SUMMARY

Aspects of the present invention include a descrambler capable of quickly identifying the correct scrambler sequence among multiple scrambler sequences and a method thereof.

In one aspect, a memory system includes a memory device and a controller including a descrambler. The descrambler receives data from the memory device. The descrambler calculates a sub-syndrome weight for multiple bits in each of the plurality of descrambled sequences using a set parity check matrix to generate multiple sub-syndrome weights, one for each of the plurality of descrambled sequences. The descrambler selects a sub-syndrome weight among the multiple sub-syndrome weights. The descrambler determines, as a correct scrambler sequence for descrambling the data, a scrambler sequence corresponding to the selected sub-syndrome weight, among the plurality of scrambler sequences.

In another aspect, a method for operating a memory system, which includes a memory device and a controller including a descrambler. The method of the descrambler includes: receiving data from the memory device; calculating a sub-syndrome weight for multiple bits in each of the plurality of descrambled sequences using a set parity check matrix to generate multiple sub-syndrome weights, one for each of the plurality of descrambled sequences; selecting a sub-syndrome weight among the multiple sub-syndrome weights; and determining, as a correct scrambler sequence for descrambling the data, a scrambler sequence corresponding to the selected sub-syndrome weight, among the plurality of scrambler sequences.

Additional aspects of the present invention will become apparent from the following description.

BRIEF DESCRIPTION OF THE DRAWINGS

FIG. 12 is a flowchart illustrating a selection operation of a scrambler sequence for descrambling in accordance with an embodiment of the present invention.

DETAILED DESCRIPTION

Figure 1:
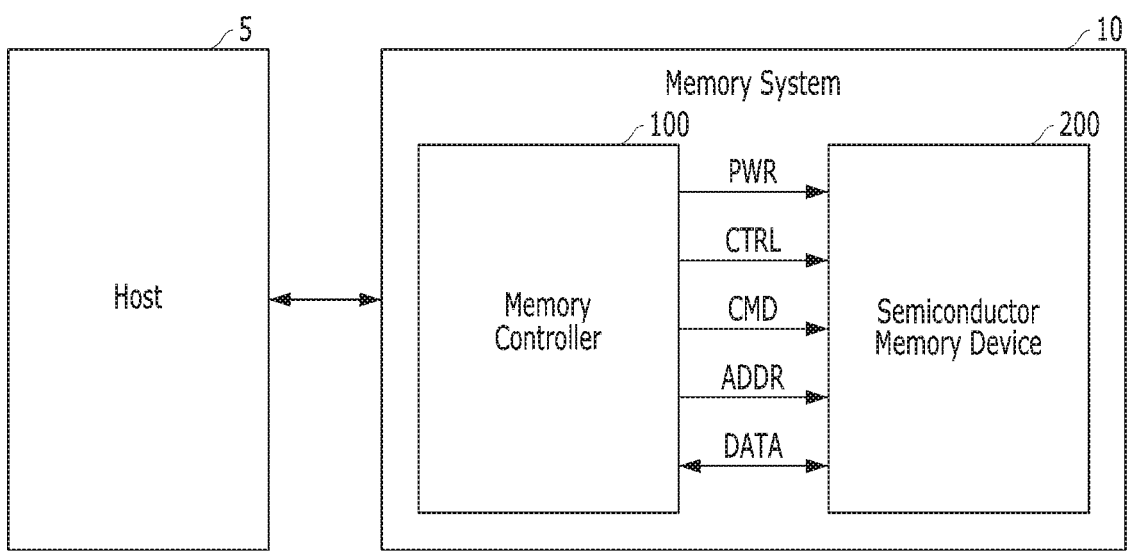
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

Figure 2:
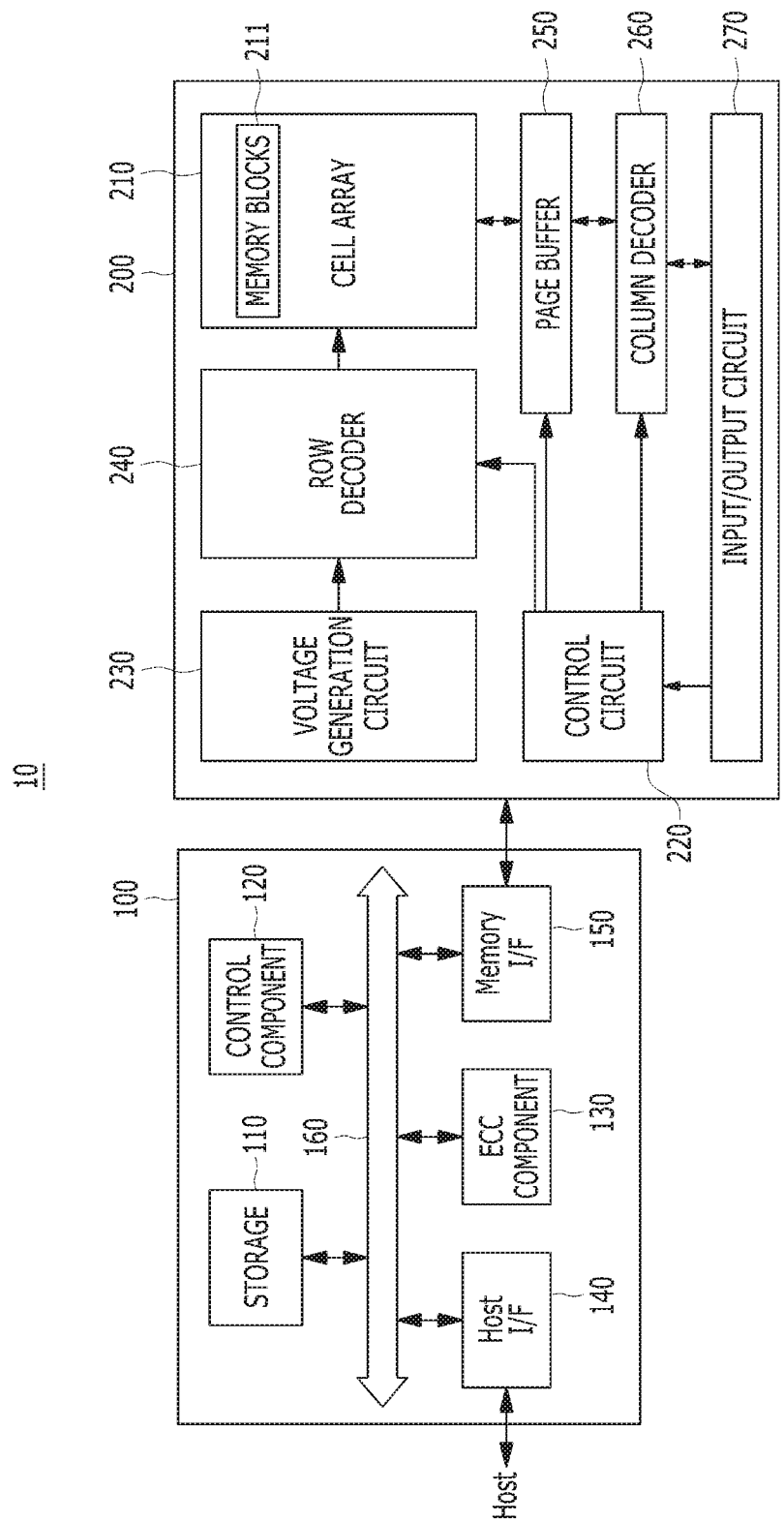
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhu Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
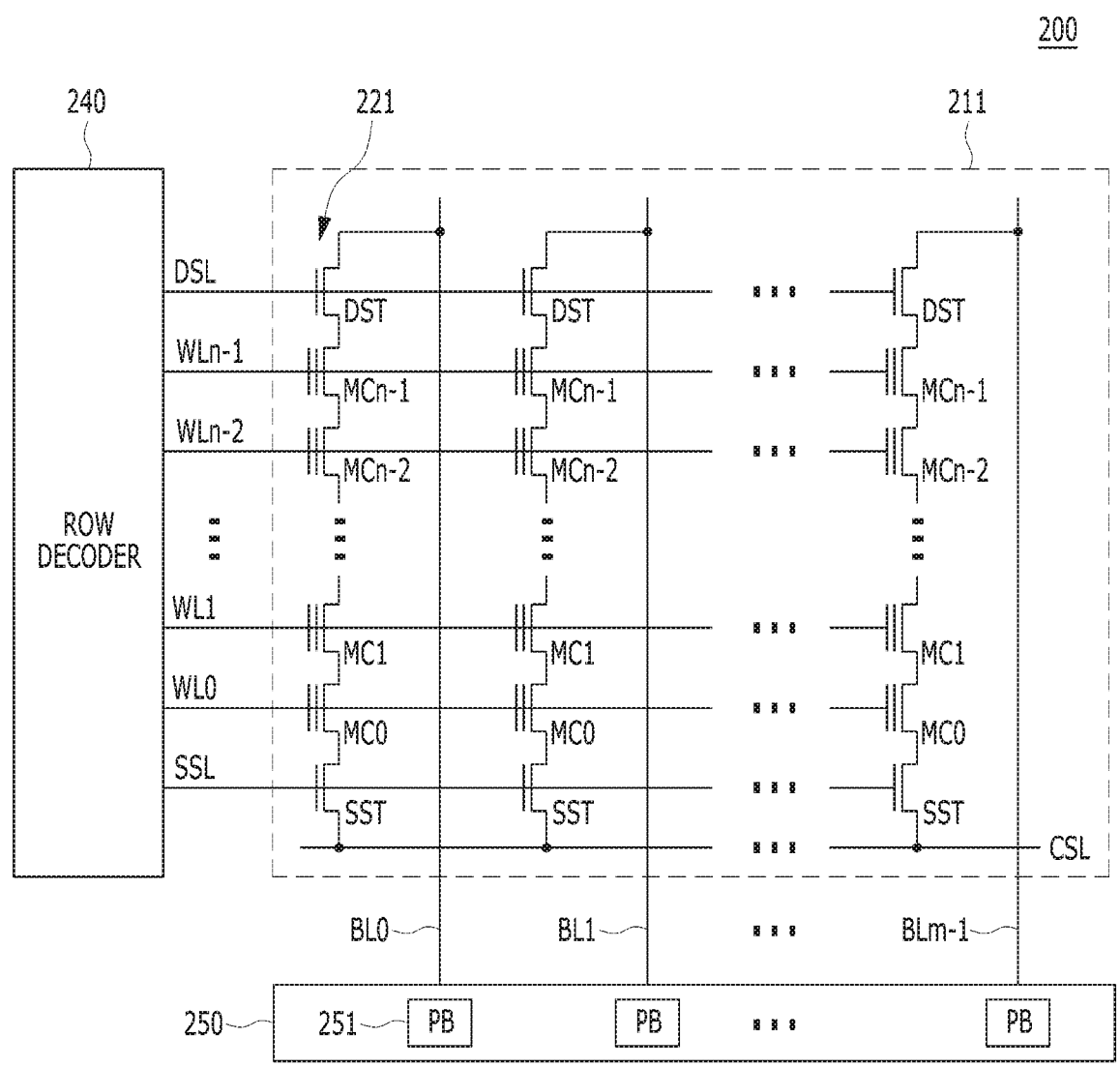
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
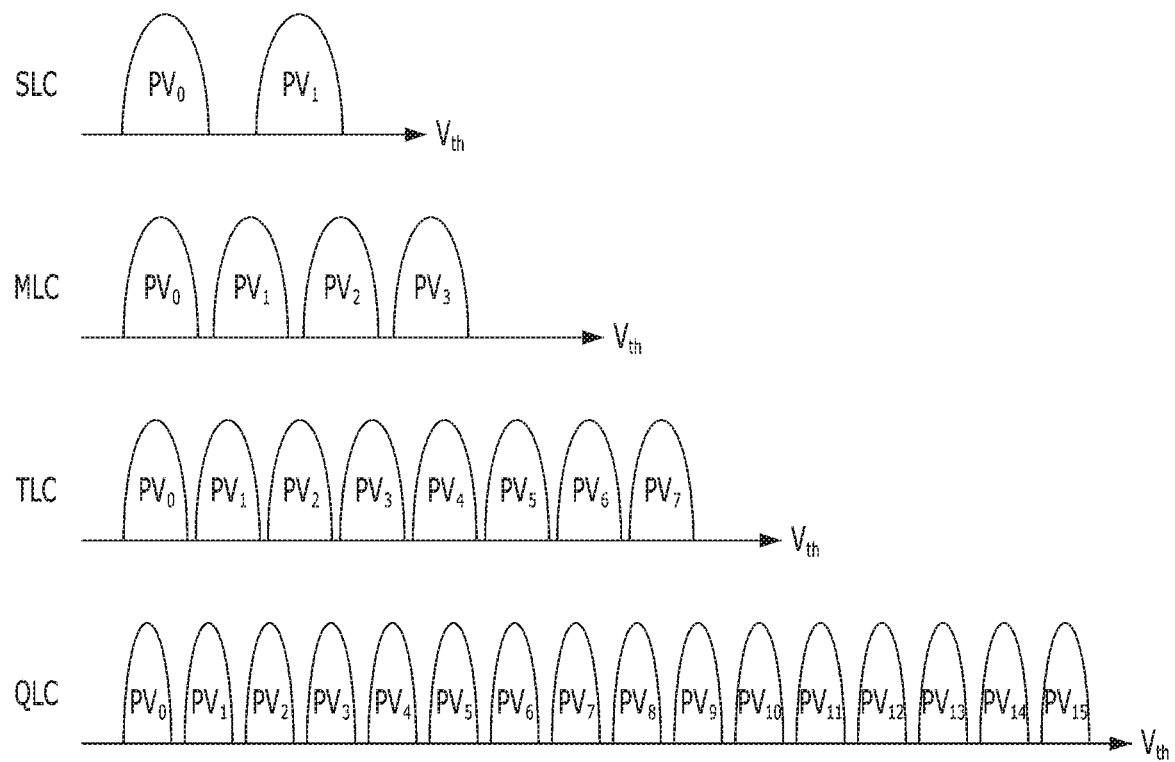
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each memory cell may be implemented as a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method. For an n-bit multiple level cell flash memory as mentioned above, cells can be modulated into any of multiple states based on their program voltage levels. SLC, MLC, TLC and QLC memories can store one bit, two bits, three bits and four bits respectively in each cell using 2, 4, 8 and 16 possible states.

Figure 5:
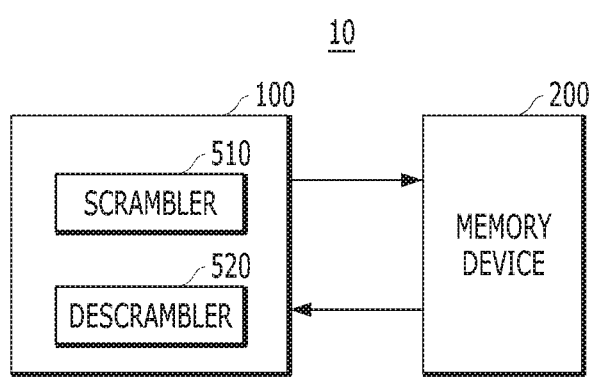
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line.

The controller 100 may include a scrambler 510 and a descrambler 520. The scrambler 510 is a component disposed in a write path from a host device (e.g., a host 5 of FIG. 1) to the memory device 200. The descrambler 520 is a component disposed in a read path from the memory device 200 to the host device. Although not shown in FIG. 5, the controller 100 and the memory device 200 may include various other components of the memory system 10 as shown in FIG. 2. The scrambler 510 may receive data from the host device and scramble (or randomize) the data to generate scrambled data. The scrambled data may be programmed in memory cells of the memory device 200. Since programming data "as is" tends to decrease endurance (e.g., lifespan) or reliability of the memory system 10, the scrambler 510 (or randomizer) randomizes data such that data is uniformly and more reliably programmed to the memory device 200. The descrambler 520 may receive data from the memory device 200 and descramble the data to generate descrambled data. The descrambled data may be provided to the host device.

Figure 6:
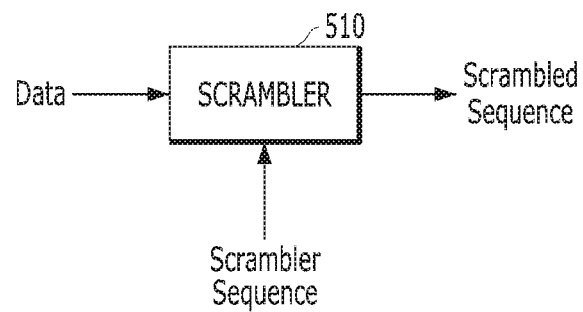
FIG. 6 is a diagram illustrating a scrambler.

FIG. 6 is a diagram illustrating the scrambler 510 of FIG. 5.

Referring to FIG. 6, the scrambler 510 may receive data from the host device. The scrambler 510 may scramble the data to generate a scrambled sequence. Scrambling may be performed by adding the scrambler sequence (e.g., a pseudo-random sequence) to the received data (i.e., an un-scrambled sequence). The scrambler 510 may be implemented with a guided scrambler 510A of FIG. 7.

Figure 7:
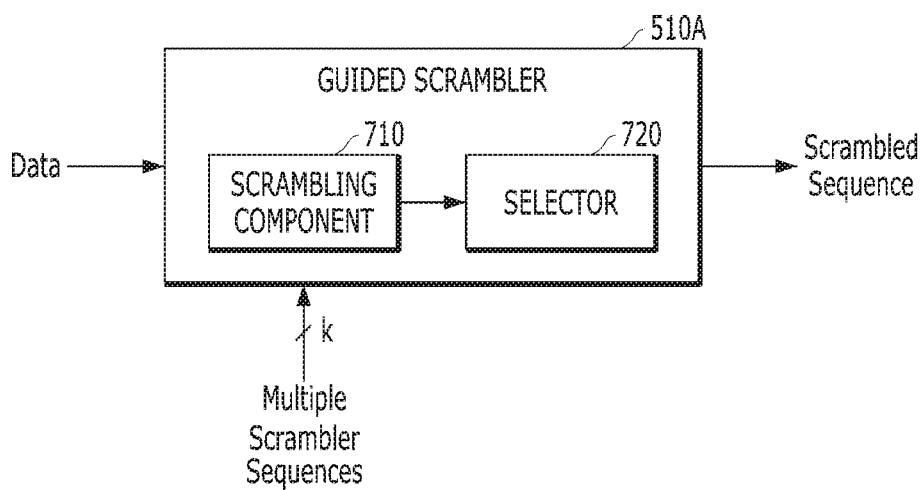
FIG. 7 is a diagram illustrating a guided scrambler in accordance with an embodiment of the present invention.

Referring to FIG. 7, the guided scrambler 510A may include a scrambling component 710 and a selector 720. The scrambling component 710 may receive the data and scramble the data using multiple scrambler sequences (e.g., k pseudo-random sequences) to generate a plurality of scrambled sequences. In some embodiments, k pseudo-random sequences may be generated by a pseudo-random number generator (PRNG). The selector 720 may select the most desirable scrambled sequence among the plurality of scrambled sequences based on a quality metric. In some embodiments, the quality metric may be the number of transitions in the scrambled sequences. If a sequence with more transitions (pairs of sequential bits of different values, e.g., a 01 sequence and/or a 10 sequence) is stored in the memory device, the reliability of the memory device will be degraded. To avoid this degradation, the selector 720 selects the best scrambler sequence among the multiple scrambler sequences, which has the lowest number of transitions in the scrambled sequences.

Figure 8:
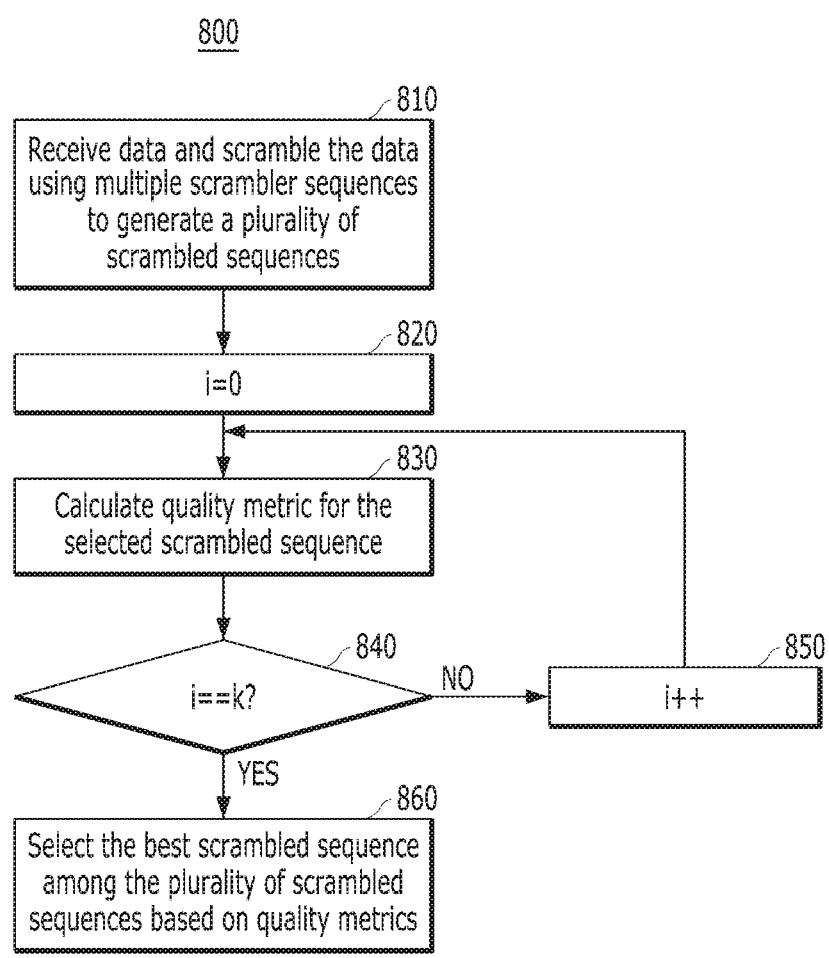
FIG. 8 is a flowchart illustrating a selection operation of a scrambler sequence for scrambling in accordance with an embodiment of the present invention.

FIG. 8 is a flowchart lustrating a selection operation 800 of a scrambler sequence for scrambling in accordance with an embodiment of the present invention. The selection operation 800 may be performed by components 710, 720 of the guided scrambler 510A in FIG. 7.

Referring to FIG. 8, at step 810, the guided scrambler 510A may receive data and scramble the data using multiple scrambler sequences (e.g., k pseudo-random sequences) to generate a plurality of scrambled sequences. The guided scrambler 510A may select a first scrambled sequence (i.e., i=0) among the plurality of scrambled sequences at step 820 and calculate a quality metric for the selected scrambled sequence at step 830. The quality metric may be the number of transitions in the scrambled sequence. After the quality metric for the first scrambled sequence is calculated, the guided scrambler 510A may select a second scrambled sequence (i.e., i++) at step 850 and calculate the quality metric for the second scrambled sequence at step 830. The calculation operation above may be performed until it is determined that the quality metric for each of k scrambled sequences is calculated, at step 840. At step 860, the selector 720 may select the best scrambled sequence among the plurality of scrambled sequences based on the quality metric of each scrambled sequence. For example, the selector 720 may select the scrambled sequence among the plurality of scrambled sequences, which has the lowest number of transitions, which scrambled sequence may be considered the best of the plurality of scrambled sequences.

Figure 9:
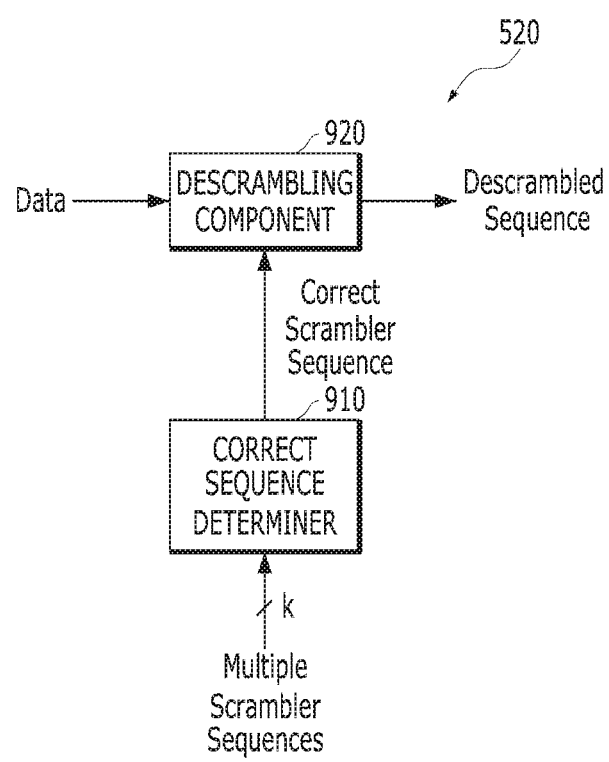
FIG. 9 is a diagram illustrating a descrambler in accordance with an embodiment of the present invention.

FIG. 9 is a diagram ilustrating a descrambler 520 in accordance with an embodiment of the present invention.

Referring to FIG. 9, the descrambler 520 may include a correct sequence determiner 910 and a descrambling component 920. The correct sequence determiner 910 may receive multiple scrambler sequences (e.g., k pseudo-random sequences) and determine a correct scrambler sequence among the multiple scrambler sequences. In some embodiments, k pseudo-random sequences may be generated by a pseudo-random number generator (PRNG). The descrambling component 920 may receive data and descramble the data using the correct scrambler sequence to generate a descrambled sequence. In some embodiments, the data may be data at the read path of a memory system. As such, at the read path, the correct scrambler sequence has to be recovered and added back to a scrambled sequence, i.e., data read from the memory device.

The correct sequence determiner 910 may be implemented with any one of various schemes. In an example, the correct scrambler sequence is identified by decoding each of descrambled sequences, which are generated using respective scrambler sequences assuming that each of the scrambler sequences is the correct one. After decoding, there will be only 1 codeword that is successfully decoded and thus the corresponding scrambler sequence is identified as the correct scrambler sequence. However, the inventors observed that this identification process takes much time resulting in long latency. Accordingly, a scheme capable of quickly identifying the correct scrambler sequence in the descrambler is desirable.

Figure 10:
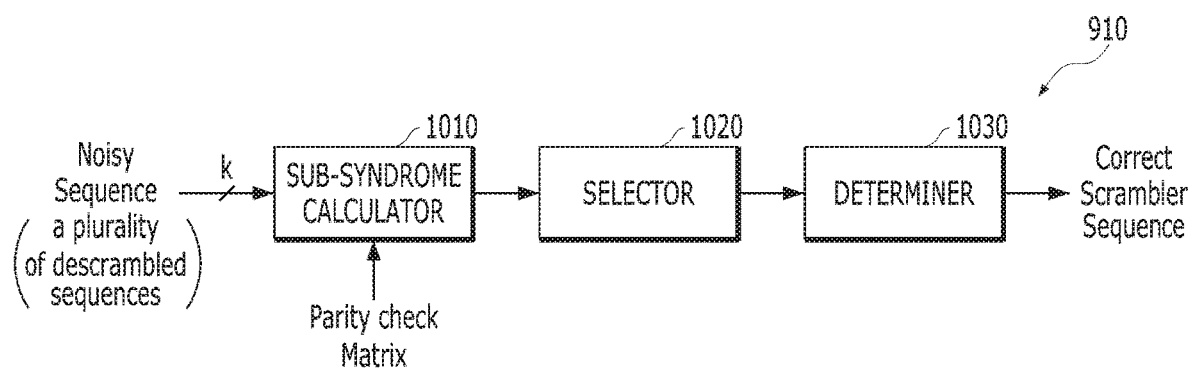
FIG. 10 is a diagram illustrating a correct sequence determiner in accordance with an embodiment of the present invention.

FIG. 10 is a diagram illustrating the correct sequence determiner 910 in accordance with an embodiment of the present invention.

Referring to FIG. 10, the correct sequence determiner 910 may include a sub-syndrome calculator 1010, a selector 1020 and a determiner 1030. The sub-syndrome calculator 1010 may receive a plurality of descrambled sequences as noisy sequences. The sub-syndrome calculator 1010 may calculate checksum (or syndrome weight) for each of the plurality of descrambled sequences. In some embodiments, for the identification process in short latency, the sub-syndrome calculator 1010 may use a subset of the bits (multiple bits) of each descrambled sequence, instead of all bits of each descrambled sequence.

The sub-syndrome calculator 1010 may calculate sub-syndrome weight for multiple bits in each of the plurality of descrambled sequences using a subset matrix in a set parity check matrix, and generate multiple sub-syndrome weights for the plurality of descrambled sequences. In some embodiments, the multiple bits may be the last q bits in each of the plurality of descrambled sequences and the parity check matrix may be a parity check matrix for a low density parity check (LDPC) code.

The parity check matrix of an LDPC code can be written as $$H = \begin{bmatrix} h11 & h12 \\ 0 & h22 \end{bmatrix},$$

where h11, h12 and h22 are QC matrices and each matrix has a circulant size of (q×q). In some embodiments, h22 may be chosen as the subset matrix, which may be, but not limited to, (2×2) QC matrix. In some variations, h22 may be a mq×nq QC matrix with circulant size q×q and the last nq bits of the descrambled sequence may be used for the sub-syndrome weight calculation.

Figure 11:
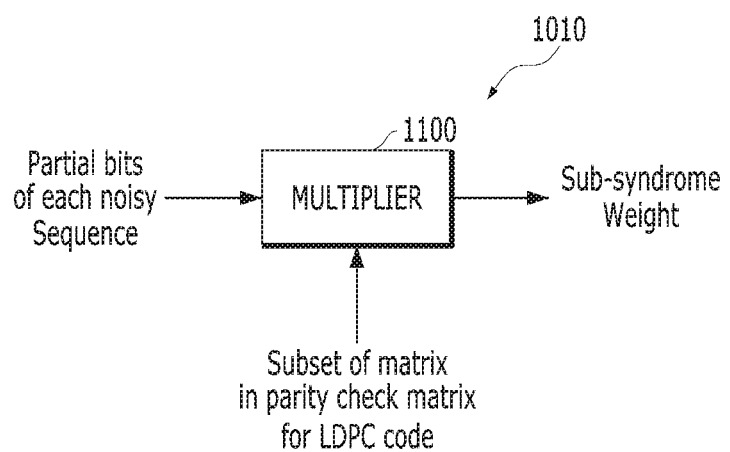
FIG. 11 is a diagram illustrating a sub-syndrome calculator in accordance with an embodiment of the present invention.

FIG. 11 is a diagram illustrating the sub-syndrome calculator 1010 in accordance with an embodiment of the present invention.

Referring to FIG. 11, the sub-syndrome calculator 1010 may be implemented with a multiplier 1100. The multiplier 1100 may multiply multiple bits in each of the plurality of descrambled sequences by a subset matrix in the set parity check matrix to calculate sub-syndrome weight for each of the plurality of descrambled sequences. As a result, the multiplier 1100 generates multiple sub-syndrome weights for the plurality of descrambled sequences.

Referring back to FIG. 10, the selector 1020 may select a sub-syndrome weight among the multiple sub-syndrome weights, which are calculated by the sub-syndrome calculator 1010. In an embodiment, the selector 1020 may select the lowest sub-syndrome weight among the multiple sub-syndrome weights. In another embodiment, the selector 1020 may compare each of the multiple sub-syndrome weights with a threshold value and select a sub-syndrome weight less than the threshold value among the sub-syndrome weights.

The determiner 1030 may determine, as a correct scrambler sequence for descrambling, a scrambler sequence corresponding to the selected sub-syndrome weight, among the plurality of scrambler sequences.

FIG. 12 is a flowchart illustrating a selection operation 1200 of a scrambler sequence for descrambling in accordance with an embodiment of the present invention. The selection operation 1200 may be performed by components 910, 920, 1010, 1020, 1030 of the descrambler 520 in FIGS. 9 to 10.

Referring to FIG. 12, at step 1210, the descrambler 520 may receive data from the memory device. At step 1220, the descrambler 520 may descramble the data with each of a plurality of scrambler sequences to generate a plurality of descrambled sequences. At step 1230, the descrambler 520 may calculate a sub-syndrome weight for partial bits (or multiple bits), i.e., some of the bits, in each of the plurality of descrambled sequences using a set parity check matrix to generate multiple sub-syndrome weights, one for each of the plurality of descrambled sequences. At step 1240, the descrambler 520 may select a sub-syndrome weight among the multiple sub-syndrome weights. At step 1250, the descrambler 520 may determine, as a correct scrambler sequence for descrambling the data, a scrambler sequence corresponding to the selected sub-syndrome weight, among the plurality of scrambler sequences.

As described above, embodiments provide a descrambler capable of quickly identifying the correct scrambler sequence among multiple scrambler sequences.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device; and
a controller including a descrambler, which is coupled to the memory device and suitable for:
receiving data from the memory device;
descrambling the data, using each of a plurality of scrambler sequences, to generate a corresponding plurality of descrambled sequences;
calculating a sub-syndrome weight for multiple bits in each of the corresponding plurality of descrambled sequences using a set parity check matrix to generate multiple sub-syndrome weights, one for each of the plurality of descrambled sequences;
selecting a sub-syndrome weight among the multiple sub-syndrome weights of the corresponding plurality of descrambled sequences; and
determining, as a correct scrambler sequence for descrambling the data, a scrambler sequence corresponding to the selected sub-syndrome weight, among the plurality of scrambler sequences,
wherein the descrambler calculates the sub-syndrome weight for the multiple bits in each of the plurality of descrambled sequences using a subset circulant matrix in a set parity check matrix,
and
wherein the multiple bits are the last nq bits in each of the plurality of descrambled sequences and the subset circulant matrix is a (mq×nq) matrix having a circulant size of (q×q) in the set parity check matrix, where m and n are integers greater than 1.

2. The memory system of claim 1, wherein the parity check matrix is a parity check matrix for a low density parity check (LDPC) code.

3. The memory system of claim 1, wherein the descrambler selects the lowest sub-syndrome weight among the multiple sub-syndrome weights.

4. The memory system of claim 1, wherein the descrambler compares each of the multiple sub-syndrome weights with a threshold value and selects a sub-syndrome weight less than the threshold value among the sub-syndrome weights.

5. The memory system of claim 1, wherein the data received from the memory system comprises randomized data.

6. The memory system of claim 5, wherein the randomized data has a minimized number of sequential bits of different values.

7. A method for operating a memory system, which includes a memory device and a controller including a descrambler coupled to the memory device, the method comprising:
receiving data from the memory device;
descrambling the data, using each of a plurality of scrambler sequences, to generate a corresponding plurality of descrambled sequences;
calculating a sub-syndrome weight for multiple bits in each of the corresponding plurality of descrambled sequences using a set parity check matrix to generate multiple sub-syndrome weights, one for each of the plurality of descrambled sequences;
selecting a sub-syndrome weight among the multiple sub-syndrome weights of the corresponding plurality of descrambled sequences; and
determining, as a correct scrambler sequence for descrambling the data, a scrambler sequence corresponding to the selected sub-syndrome weight, among the plurality of scrambler sequences,
wherein the calculating of the sub-syndrome weight for multiple bits in each of the plurality of descrambled sequences comprises:
calculating the sub-syndrome weight for the multiple bits in each of the plurality of descrambled sequences using a subset circulant matrix in a set parity check matrix,
and
wherein the multiple bits are the last nq bits in each of the plurality of descrambled sequences and the subset circulant matrix is a (mq×nq) matrix having a circulant size of (q×q) in the set parity check matrix, where m and n are integers greater than 1.

8. The method of claim 7, wherein the parity check matrix is a parity check matrix for a low density parity check (LDPC) code.

9. The method of claim 7, wherein the selecting of the sub-syndrome weight among the multiple sub-syndrome weights comprises:
selecting the lowest sub-syndrome weight among the multiple sub-syndrome weights.

10. The method of claim 7, wherein the selecting of the sub-syndrome weight among the multiple sub-syndrome weights comprises:
comparing each of the multiple sub-syndrome weights with a threshold value; and
selecting a sub-syndrome weight less than the threshold value among the sub-syndrome weights.

11. The method of claim 7, wherein the data received from the memory system comprises randomized data.

12. The method of claim 11, wherein the randomized data has a minimized number of sequential bits of different values.

* * * * *